United States Patent
Kuwayama et al.

(10) Patent No.: US 7,040,914 B2
(45) Date of Patent: May 9, 2006

(54) ELECTRIC CONNECTING TERMINAL

(75) Inventors: Yasumichi Kuwayama, Shizuoka (JP); Masanori Onuma, Shizuoka (JP); Nobuyuki Asakura, Shizuoka (JP)

(73) Assignee: Yazaki Corporation, Tokyo (JP)

( * ) Notice: Subject to any disclaimer, the term of this patent is extended or adjusted under 35 U.S.C. 154(b) by 8 days.

(21) Appl. No.: 09/910,872

(22) Filed: Jul. 24, 2001

(65) Prior Publication Data

US 2002/0013083 A1     Jan. 31, 2002

(30) Foreign Application Priority Data

Jul. 24, 2000 (JP) ............................. 2000-222621

(51) Int. Cl.
*H01R 4/24* (2006.01)
(52) U.S. Cl. ..................................... 439/422
(58) Field of Classification Search ........ 439/421–426, 439/492–499, 865–868, 877–882, 389, 442
See application file for complete search history.

(56) References Cited

U.S. PATENT DOCUMENTS

| | | | |
|---|---|---|---|
| 4,082,402 A | | 4/1978 | Kinkaid et al. |
| 4,371,225 A | * | 2/1983 | Narozny ..................... 439/442 |
| 4,560,224 A | * | 12/1985 | Weisenburger ............... 439/422 |
| 4,561,714 A | * | 12/1985 | Byczek et al. ............... 439/408 |
| 4,564,253 A | | 1/1986 | Sinclair |
| 4,833,775 A | | 5/1989 | Nager, Jr. |
| 5,137,468 A | * | 8/1992 | Murakami ................... 439/422 |
| 5,195,908 A | | 3/1993 | Yamamoto et al. |
| 5,484,961 A | * | 1/1996 | Itoh et al. .................. 174/84 C |
| 5,611,709 A | | 3/1997 | McAnulty |
| 6,135,779 A | * | 10/2000 | Koch et al. .................. 439/422 |
| 6,350,145 B1 | * | 2/2002 | Chen et al. .................. 439/422 |

FOREIGN PATENT DOCUMENTS

| | | |
|---|---|---|
| DE | 31 27 704 | 5/1982 |
| DE | 39 37 089 | 5/1990 |
| DE | 199 48 261 | 4/2001 |
| EP | 1 083 633 | 3/2001 |
| GB | 1 274 538 | 5/1972 |
| GB | 1 353 026 | 5/1974 |
| GB | 1 576 021 | 2/1977 |
| GB | 1 480 162 | 7/1977 |
| GB | 1 567 732 | 5/1980 |
| JP | 53-38686 | 4/1978 |
| JP | 57-55076 A | 4/1982 |
| JP | 2-98466 | 8/1990 |
| JP | 10-510668 A | 10/1998 |
| JP | 11-144780 | 5/1999 |

* cited by examiner

*Primary Examiner*—Ross Gushi
(74) *Attorney, Agent, or Firm*—Sughrue Mion, PLLC

(57) ABSTRACT

An electric connecting terminal (21) is connected to a flat circuit body (1) by causing tips of one pair of piercing portions (25, 26) erected on both side edges of a plane portion (23) to penetrate through a coating (5) and a conductor (4a) in the flat circuit body (1) and then folding the tips in such a direction as to approach each other. Taper surfaces (25b, 26b) for gradually reducing a plate thickness toward the tip are provided on internal surface sides of the piercing portions (25, 26).

6 Claims, 9 Drawing Sheets

ELECTRIC CONNECTING TERMINAL

BACKGROUND OF THE INVENTION

1. Technical Field of the Invention

The present invention relates to an improvement in an electric connecting terminal, wherein tips of at least one pair of piercing portions erected on both side edges of a plane portion of the electric connecting terminal penetrate through a coating and a conductor in a flat circuit body and then the tips is fold in such a direction as to approach each other, thereby connecting the electric connecting terminal to the flat circuit body.

2. Related Art

FIG. 14 shows a flat circuit body 1 and a related electric connecting terminal 2 to be connected to the flat circuit body 1.

The flat circuit body 1 is an FFC (flexible flat cable) which is finished to be a band-shaped cable having a flexibility as a whole by coating a plurality of elongated thin-plate shaped conductors 4a, 4b, . . . with a thin film-shaped insulating coating 5. The conductors 4a, 4b, . . . are formed by various manufacturing methods, for example, are formed by pattern printing or by sticking a preformed tape-like conductive material onto an insulating sheet.

The electric connecting terminal 2 is disclosed in JP-A-11-144780, for example, and has such a structure that a plane portion 6, a plurality of pairs of piercing portions 7 and 8 erected on opposite side edges at the base side of the plane portion 6 and a terminal connecting portion which is formed on the tip side of the plane portion 6 and is not shown are integrally provided.

The terminal connecting portion (not shown) is to be connected to another connecting terminal and, for example, is formed to have a female terminal structure to be accommodated and held in a connector housing or a male terminal structure.

The piercing portions 7 and 8 are provided with taper portions 7a and 8a having a width gradually reduced from a base portion toward a tip and an almost triangular shape seen from the side such that the flat circuit body 1 can be easily pierced and penetrated. Taper surfaces 7b and 8b for gradually reducing a plate thickness toward a tip are also provided on the external surface side of a tip portion.

The electric connecting terminal 2 is a so-called piercing terminal, and the tips of the piercing portions 7 and 8 provided on opposite side edges of the plane portion 6 penetrate through the coating 5 and the conductor 4a (4b) in the flat circuit body 1 by using a caulking device 9 and are then folded in such a direction as to approach each other as shown in FIGS. 15 and 16. As shown in FIG. 17, consequently, the electric connecting terminal 2 is connected to the flat circuit body 1 electrically and mechanically.

More specifically, the conductor 4a (4b) of the flat circuit body 1 can be connected to the electric connecting terminal 2 by causing each of the tips of the piercing portions 7 and 8 to penetrate through the flat circuit body 1 and folding the tip without peeling the flat circuit body 1. Consequently, the number of the processing steps required for the connection can be reduced so that a work for wiring the flat circuit body 1 can be carried out at a lower cost.

In order to enhance the conducting reliability in a connecting structure between the flat circuit body 1 and the electric connecting terminal 2 shown in FIG. 17, it is important that a contact area or a contact pressure between the piercing portions 7 and 8 penetrating through the conductor 4a (4b) of the flat circuit body 1 and the shear plane of the conductor 4a (4b) should be increased.

With respect to a contact pressure between the conductor 4a (4b) of the flat circuit body 1 and the piercing portions 7 and 8, as a compression stress $F_p$ is greater, the contact pressure is increased. The compression stress $F_p$ is defined by stress due to the contact between inner surfaces 7c and 8c of the base internal portion 7c and 8c of the piercing portions 7 and 8 and the shear plane of the conductor 4a (4b) as shown in FIG. 17 when the tip sides of the piercing portions 7 and 8 penetrating through the flat circuit body 1 are folded and molded in such direction as to approach each other.

However, in the related electric connecting terminal 2, when the tips of the piercing portions 7 and 8 are caused to pierce the flat circuit body 1, the taper surfaces 7b and 8b formed on the external surface side of the tip portions of the piercing portions 7 and 8 undergoes an inward drag $T_1$ as shown in FIG. 18. Therefore, the piercing portions 7 and 8 penetrating through the flat circuit body 1 is easily brought into such a state as to be tilted inwardly.

When folding and molding are to be carried out by the caulking device 9 while the piercing portions 7 and 8 are tilted inwardly, the compression stress FP in a transverse direction which is to be applied to the conductor 4a (4b) present between the piercing portions 7 and 8 by the base internal surfaces 7c and 8c is reduced and it becomes difficult to increase the contact pressure.

More specifically, in the related electric connecting terminal 2, it is hard to maintain a sufficient contact pressure between the conductor 4a (4b) and each of the piercing portions 7 and 8. As shown in an arrow (A) of FIG. 19, when the tip returns by a spring back after the folding and molding, the contact pressure between the base internal surfaces 7c and 8c and the conductor 4a (4b) is reduced. Consequently, there is a possibility that conducting reliability may be deteriorated or a mechanical connecting strength may be reduced.

Moreover, the piercing portions 7 and 8 of the related electric connecting terminal 2 have almost triangular shapes seen from the side by the taper portions 7a and 8a from a base portion to a tip. The cross-sectional areas of the piercing portions 7 and 8 are gradually reduced toward the tip side. For example, therefore, it is also supposed that the area of the contact with the conductor 4a (4b) is decreased so that the conducting reliability is deteriorated when a return is generated in a direction of penetration shown in an arrow (B) of FIG. 19 through the spring back after the repetitive folding and molding.

SUMMARY OF THE INVENTION

The invention has an object to solve the problems and to provide an excellent electric connecting terminal capable of enhancing conducting reliability for a flat circuit body.

To achieve the above object, according to a first aspect of the invention, there is provided an electric connecting terminal to be connected to a flat circuit body comprising:

a plane portion;

a pair of piercing portions erected from opposite side edges of the plane portion adapted to penetrate through a coating and a conductor of the flat circuit body and fold tips thereof in such a direction as to approach each other; and a taper surface for gradually reducing a thickness of the piercing portion provided on an internal surface of each piercing portion.

According to the first aspect, when each of the tips of the piercing portions erected on both side edges of the plane portion of the electric connecting terminal is caused to penetrate through the conductor of the flat circuit body, the taper surfaces provided on the internal surface sides of the piercing portions cause such a drag as to compress and curve the conductor in a transverse direction to act on the conductor at the inside of a base portion between the opposed piercing portions.

In the conductor curved between the opposed piercing portions, a shear plane can maintain a sufficient contact pressure for the internal surface of the base portion of each of the piercing portions by an elastic repulsion. Thus, excellent conducting reliability can be maintained.

According to a second aspect of the invention, in the electric connecting terminal of the first aspect, an external surface opposed to the internal surface of each piercing portion is provided with a taper surface for gradually reducing the thickness of the piercing portion.

In this case, the taper surface provided on the external surface side of each of the piercing portions functions as a guide surface to relieve a resistance of contact with a mold of a caulking device during folding and molding, thereby easily deforming the tip of the piercing portion during caulking and molding. Therefore, a moldability for folding and molding the piercing portion can also be enhanced.

Moreover, to achieve the object of the invention, according to a third aspect of the invention, there is provided an electric connecting terminal to be connected to a flat circuit body comprising:

a plane portion; and a pair of piercing portions erected from opposite side edges of the plane portion adapted to penetrate through a coating and a conductor of the flat circuit body and fold tips thereof in such a direction as to approach each other, wherein each piercing portion includes a portion which have an approximately constant width, is located adjacent to the plane portion and penetrates through the conductor.

According to the third aspect, as compared with a conventional electric connecting terminal having an almost triangular shape seen from the side by a taper portion reaching a tip from a base portion, the contact area on the base side of each piercing portion which is in contact with the shear plane of the conductor can be increased. Correspondingly, the conducting reliability can be enhanced.

Furthermore, the base side of the piercing portion has an almost constant cross-sectional area. Therefore, even if a return is generated in the direction of penetration through the spring back after folding and molding, the area of the contact with the conductor can be prevented from being reduced and excellent conducting reliability can be maintained.

According to a fourth aspect of the invention, in the electric connecting terminal of one of the first to third aspects, the first tip of one of the piercing portions, which penetrates through the flat circuit body, is inverted toward the plane portion and is caused to pierce the conductor, and the second tip of the other piercing portion is superposed on the first tip for urging the first tip toward the plane portion.

In this case, when a pair of piercing portions to pierce the flat circuit body are to penetrate through the flat circuit body and to be folded, the tip of one of the piercing portions is superposed on that of the other piercing portion. Therefore, only the occupied width of almost one of the piercing portions is enough for the occupied width of the piercing portions. Therefore, it is possible to considerably reduce the occupied width on the flat circuit body of one electric connecting terminal. Thus, the array pitch of the conductor on the flat circuit body can be reduced.

Moreover, the tip of one of the piercing portions to be folded earlier after penetrating through the flat circuit body is brought into such a state as to pierce the conductor of the flat circuit body again and is pressed by the tip of the other piercing portion. Therefore, it is possible to control the spring back of one of the piercing portions through the tip of the other piercing portion.

The fixation of the electric connecting terminal to the flat circuit body can be prevented from being loosened by the spring back and the conducting reliability for the flat circuit body can also be enhanced.

Furthermore, to achieve the object of the invention, according to a fifth aspect of the invention, there is provided a electric connecting terminal to be connected to a flat circuit body comprising:

a plane portion; and a pair of piercing portions erected from opposite side edge of the plane portion adapted to be fold in such a direction as to approach each other, each of the piercing portions including, a first portion, one end of the first portion being connected to the edge of the plane portion, and a second portion connected to the other end of the first portion including a tip and a taper surface for gradually reducing a thickness of the second portion, wherein the pair of the taper surfaces face each other over the plane portion.

According to a sixth aspect of the invention, in the electric connecting terminal of the fifth aspect, a width of the second portion becomes gradually narrow toward the tip thereof.

According to a seventh aspect of the invention, in the electric connecting terminal of the fifth aspect, the first portion has an approximately constant width.

According to an eighth aspect of the invention, in the electric connecting terminal of the seventh aspect, a width of the second portion becomes gradually narrow toward the tip thereof.

According to a ninth aspect of the invention, in the electric connecting terminal of the fifth aspect, the second portion includes the taper surfaces on opposite sides thereof.

DETAILED DESCRIPTION OF PREFERRED EMBODIMENT

An electric connecting terminal according to an embodiment of the invention will be described below in detail with reference to the drawings.

Figure 1:
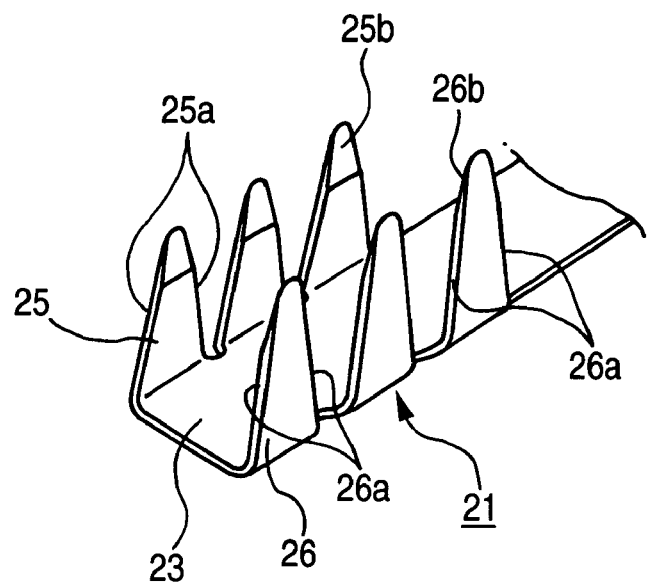
FIG. 1 is a perspective view showing a main part of an electric connecting terminal according to a first embodiment of the invention.
Figure 2:
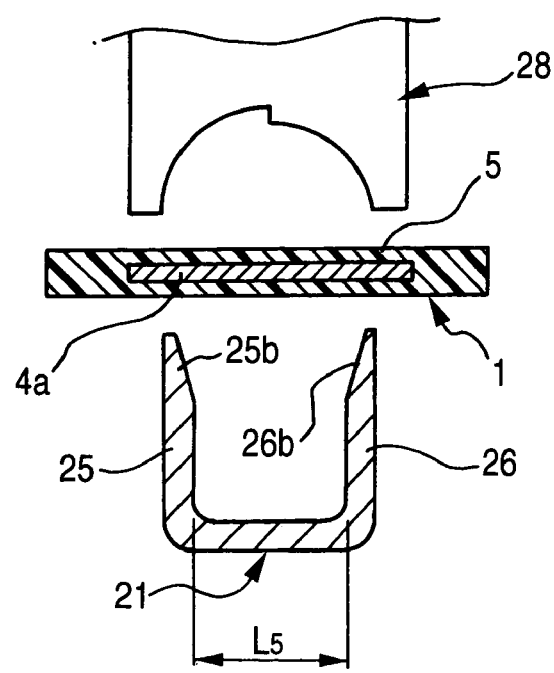
FIG. 2 is a cross-sectional view illustrating a procedure for connecting the electric connecting terminal shown in FIG. 1 to a flat circuit body.
Figure 3:
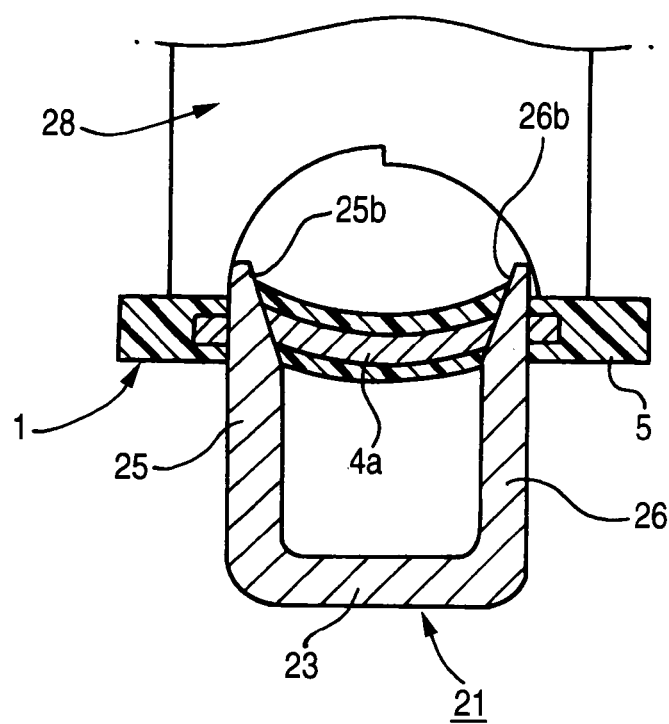
FIG. 3 is a cross-sectional view illustrating the procedure for connecting the electric connecting terminal shown in FIG. 1 to the flat circuit body.
Figure 4:
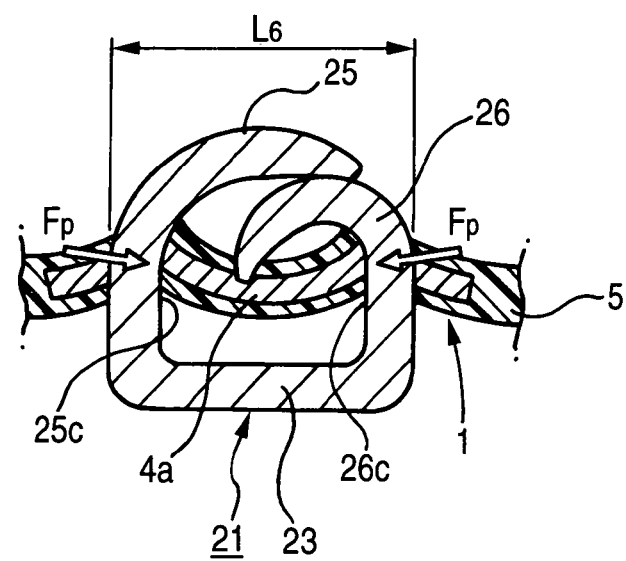
FIG. 4 is a cross-sectional view illustrating a state in which the electric connecting terminal shown in FIG. 1 is connected to the flat circuit body.
Figure 5:
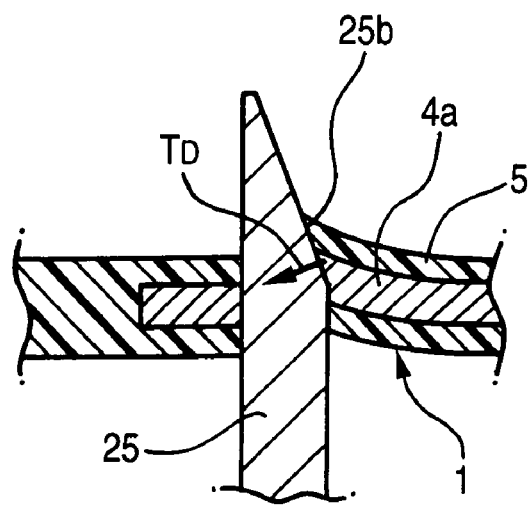
FIG. 5 is an enlarged sectional view illustrating a main part of a procedure for connecting the electric connecting terminal shown in FIG. 3 to the flat circuit body.

FIG. 1 is a perspective view showing a main part of an electric connecting terminal according to a first embodiment of the invention, FIGS. 2 and 3 are cross-sectional views illustrating a procedure for connecting the electric connecting terminal shown in FIG. 1 to a flat circuit body, FIG. 4 is a cross-sectional view showing a state in which the electric connecting terminal illustrated in FIG. 1 is connected to the flat circuit body, and FIG. 5 is an enlarged sectional view illustrating a main part of a procedure for connecting the electric connecting terminal shown in FIG. 3 to the flat circuit body.

Figure 14:
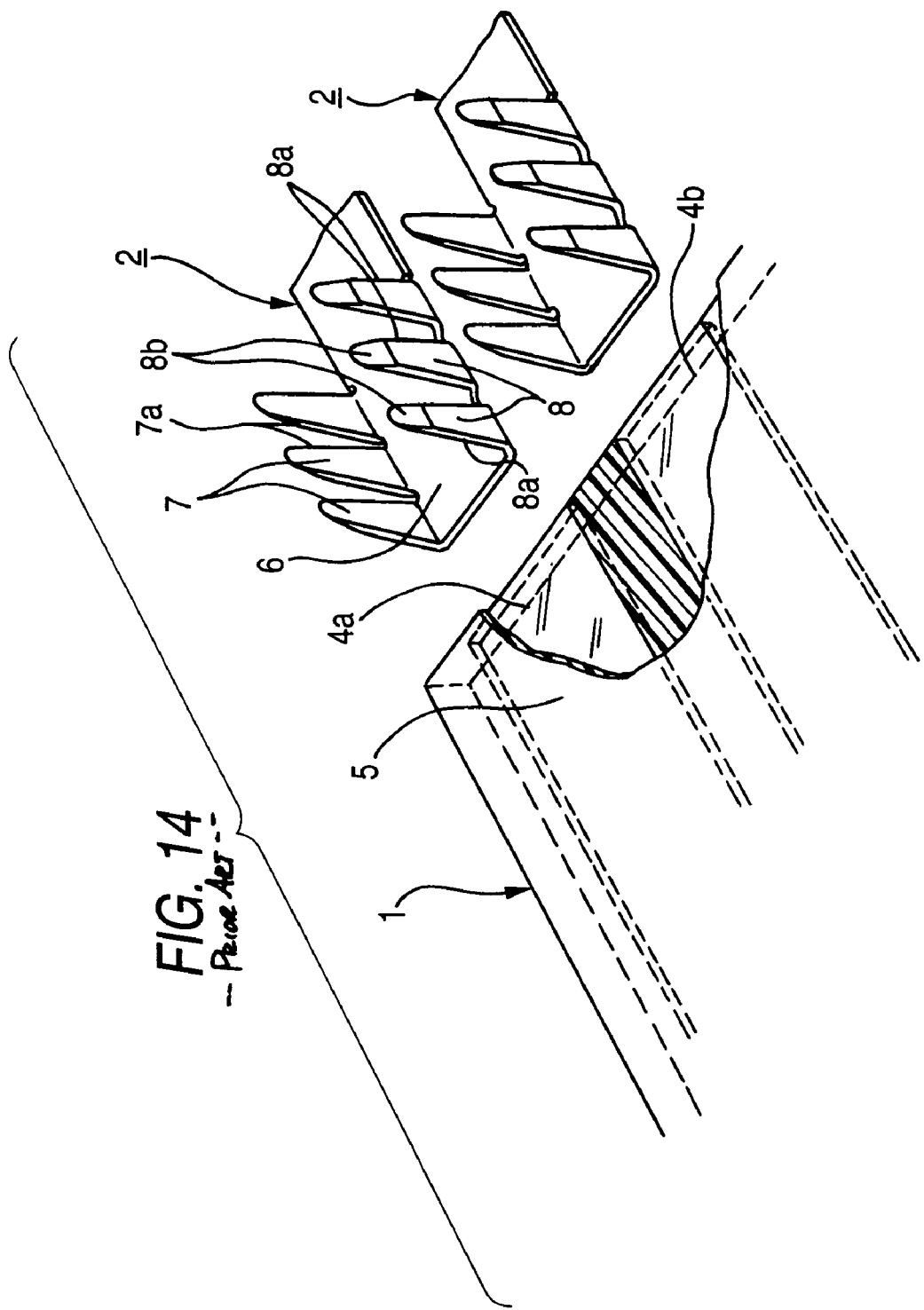
FIG. 14 is a perspective view showing a main part of the related electric connecting terminal and a flat circuit body.

A flat circuit body 1 for connecting an electric connecting terminal 21 according to the first embodiment has the same structure as that of the flat circuit body 1 shown in FIG. 14 and is an FFC (flexible flat cable) which is finished to be a band-shaped cable having a flexibility as a whole by coating a plurality of elongated thin-plate shaped conductors 4a, 4b, . . . with a thin film-shaped insulating coating 5. An FPC (flexible printed board) having a conductor formed by pattern printing and the like can also be used for the flat circuit body according to the invention.

The electric connecting terminal 21 according to the first embodiment has such a structure that a plane portion 23, three pairs of piercing portions 25 and 26 erected on opposite side edges of the plane portion 23 at the base end side. A terminal connecting portion (not shown) which is formed on the tip side of the plane portion 23 are integrally formed of a conductive metal plate as shown in FIGS. 1 to 4.

The terminal connecting portion (not shown) is to be connected to another connecting terminal and, for example, is formed to have a female terminal structure to be accommodated and held in a connector housing or a male terminal structure.

As shown in FIGS. 2 to 4, the electric connecting terminal 21 is a so-called piercing terminal to be connected to the flat circuit body 1 by causing tips of the pair of the piercing portions 25 and 26 to penetrate through the coating 5 and the conductor 4a in the flat circuit body 1 and folding the tips in such a direction as to approach each other through a caulking device 28.

In the electric connecting terminal 21 according to the first embodiment, the shape of each of the piercing portions 25 and 26 in view from the side is almost triangular defined by taper portions 25a and 26a from base portions to the tips. Taper surfaces 25b and 26b for gradually reducing plate thicknesses toward the tips are provided on the internal surface sides of the piercing portions 25 and 26.

When each of the tips of the piercing portions 25 and 26 erected from opposite side edges of the plane portion 23 of the electric connecting terminal 21 is to be caused to penetrate through the coating 5 and the conductor 4a in the flat circuit body 1, the taper surfaces 25b and 26b provided on the internal surface sides of the piercing portions 25 and 26 cause such a drag as to compress and curve the conductor 4, at the inside of the base portions (the right in FIG. 5) between the opposed piercing portions 25 and 26, in a width direction to act on the conductor 4a as shown in FIGS. 3 and 5.

In the conductor 4a curved between the opposed piercing portions 25 and 26, a shear plane can maintain a sufficient contact pressure for base internal surfaces 25c and 26c of the piercing portions 25 and 26 by a compression stress $F_p$ in the width direction and a self elastic repulsion $T_D$ as shown in FIGS. 4 and 5. The compression stress $F_p$ is the stress in which the base internal surfaces 25c and 26c act on the conductor 4a between the piercing portions 7 and 8.

Accordingly, even if a return is generated on the bent tips of the piercing portions 25 and 26 by a spring back after folding and molding, deterioration of conducting reliability due to reducing the pressure of contact of the base internal surfaces 25c and 26c with the shear plane of the conductor 4a can be prevented.

Figure 15:
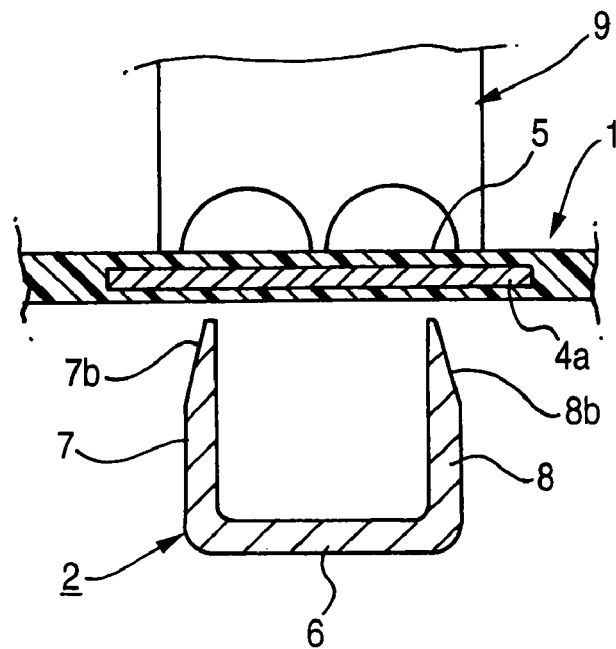
FIG. 15 is a cross-sectional view illustrating a procedure for connecting the electric connecting terminal shown in FIG. 14 to the flat circuit body.
Figure 16:
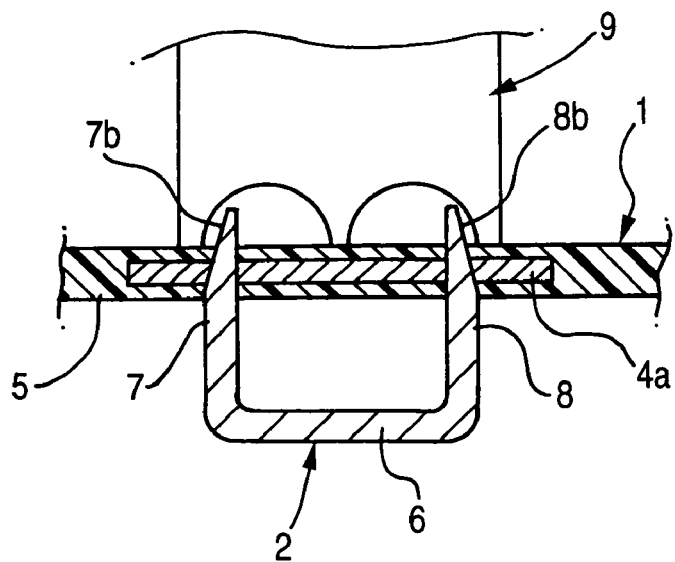
FIG. 16 is a cross-sectional view illustrating the procedure for connecting the electric connecting terminal shown in FIG. 14 to the flat circuit body.

In the electric connecting terminal 21 according to the embodiment, a space $L_5$ between the piercing portions 25 and 26 as a pair as shown in FIG. 2 is set to be smaller than a space between the piercing portions 7 and 8 in the related electric connecting terminal 2 shown in FIG. 15.

As shown in FIGS. 3 and 4, the tip of the piercing portion 26 penetrating through the coating 5 and the conductor 4a in the flat circuit body 1 is inverted toward the plane portion 23 side and is caused to pierce the conductor 4a again, and the tip of the other piercing portion 25 is superposed on the tip of the piercing portion 26 to be energized in the direction of the plane portion 23. Thus, the electric connecting terminal 21 is connected to the flat circuit body 1.

More specifically, according to the electric connecting terminal 21 in accordance with the invention, when the pair of the piercing portions 25 and 26 to pierce the flat circuit body 1 penetrate through the flat circuit body 1 and folded, the tip of the piercing portion 25 is superposed on that of the other piercing portion 26. Therefore, the occupied width of almost the piercing portion 26 is enough for an occupied width $L_6$ of the piercing portions as shown in FIG. 4.

Figure 17:
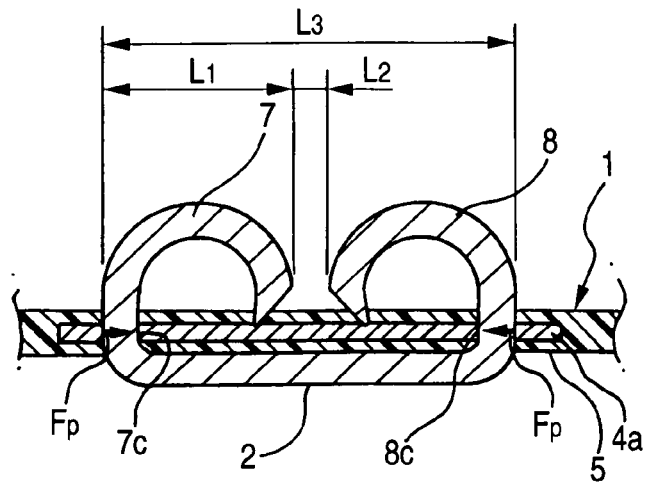
FIG. 17 is a cross-sectional view in which the electric connecting terminal shown in FIG. 14 is connected to the flat circuit body.
Figure 18:
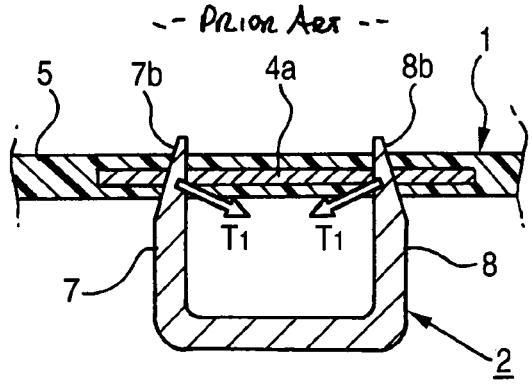
FIG. 18 is a cross-sectional view illustrating drawbacks caused when each piercing portion of the electric connecting terminal shown in FIG. 14 is caused to penetrate through the flat circuit body.
Figure 19:
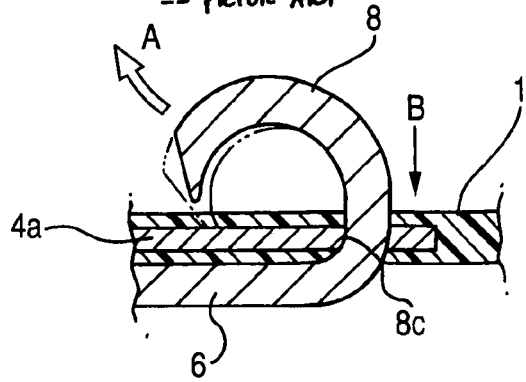
FIG. 19 is a sectional view illustrating a main part of a behavior of a spring back in each piercing portion of the electric connecting terminal shown in FIG. 14.

As compared with the related electric connecting terminal 21 in which a pair of piercing portions 7 and 8 individually require an occupied width $L_1$ respectively and a clearance $L_2$ should be provided between the piercing portions 7 and 8 as shown in FIG. 17, the electric connecting terminal 21 in accordance with the embodiment can considerably reduce the occupied width $L_6$ on the flat circuit body 1 of one electric connecting terminal 21, and further, an array pitch of the conductors 4a, 4b . . . on the flat circuit body 1 can be reduced. Therefore, the width of the flat circuit body 1 can be reduced.

Moreover, after penetrating through the flat circuit body 1, the tip of the piercing portion 26 to be folded earlier is brought into such a state as to pierce the conductor 4a of the flat circuit body 1 again and is pressed by the tip of the other piercing portion 25. Therefore, it is possible to restrict the spring back of the piercing portion 26 through the tip of the other piercing portion 25.

The fixation of the electric connecting terminal 21 to the flat circuit body 1 can be prevented from being loosened by the spring back, and the conducting reliability for the flat circuit body 1 can also be enhanced.

Figure 6:
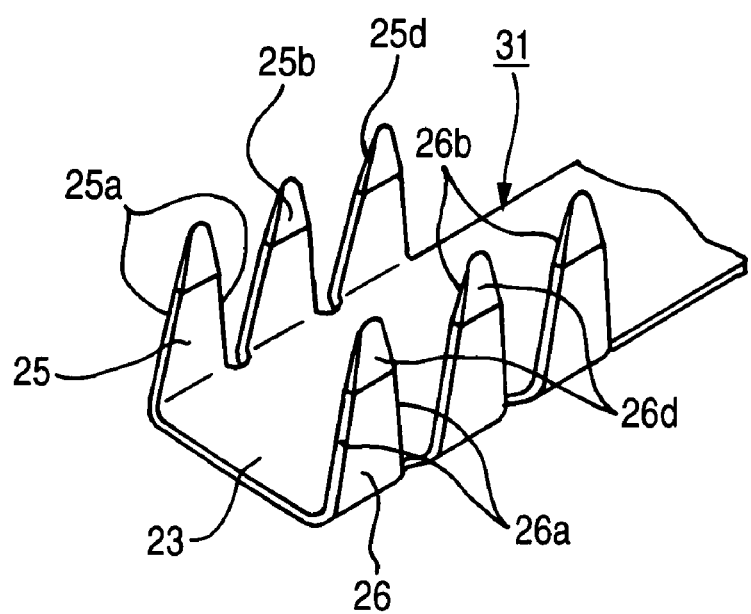
FIG. 6 is a perspective view showing a main part of an electric connecting terminal according to a second embodiment of the invention.
Figure 7:
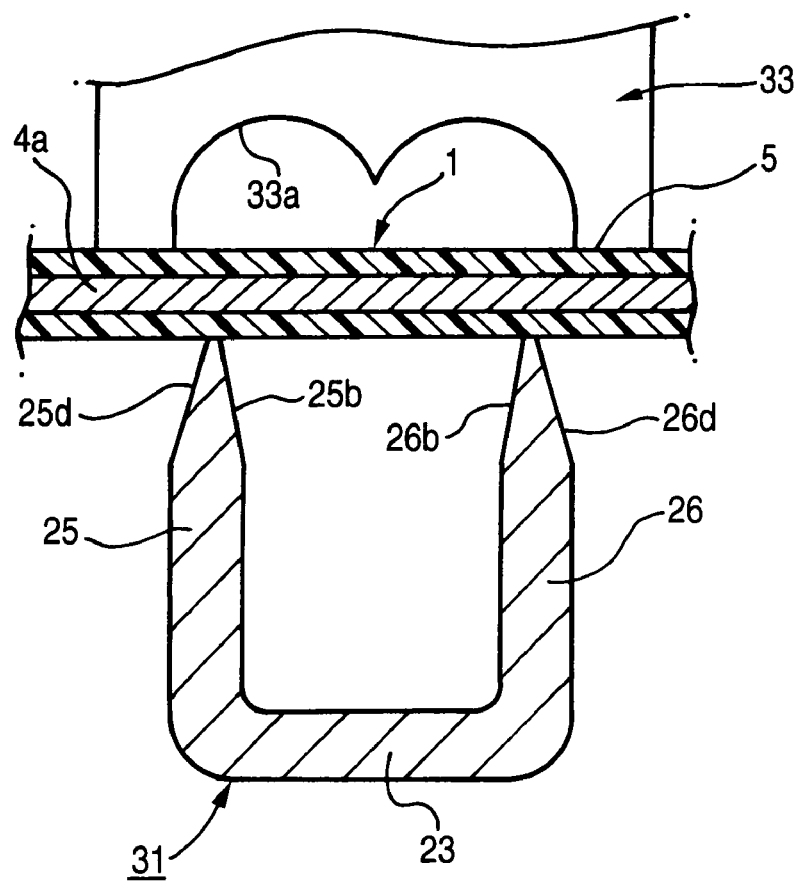
FIG. 7 is a cross-sectional view illustrating a procedure for connecting the electric connecting terminal shown in FIG. 6 to a flat circuit body.
Figure 8:
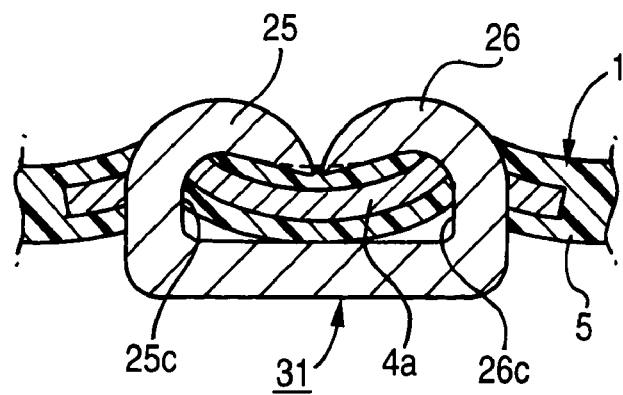
FIG. 8 is a cross-sectional view in which the electric connecting terminal shown in FIG. 1 is connected to the flat circuit body.

FIGS. 6 to 8 show an electric connecting terminal 31 according to a second embodiment of the invention.

The electric connecting terminal 31 according to the second embodiment has such a structure that taper surfaces 25d and 26d for gradually reducing plate thicknesses toward tips are added to the external surface sides of the piercing portions 25 and 26 of the electric connecting terminal 21 according to the first embodiment. Common components to those of the electric connecting terminal 21 according to the first embodiment have the same reference numerals and detailed description will be omitted.

As shown in FIGS. 6 and 7, the taper surfaces 25d and 26d are provided symmetrically in the direction of the plate thickness with respect to taper surfaces 25b and 26b formed on the internal surface sides of the piercing portions 25 and 26.

In the electric connecting terminal 31, a contact pressure between base internal surfaces 25c and 26c of the piercing portions 25 and 26 and the shear plane of a conductor 4a is increased by the action of the taper surfaces 25b and 26b provided on the internal surface sides of the tips of the piercing portions 25 and 26 in the same manner as that in the first embodiment. Consequently, conducting reliability can be enhanced.

The taper surfaces 25d and 26d provided on the external surface sides of the piercing portions 25 and 26 function as guide surfaces to relieve a resistance of contact with a molded surface 33a of a mold 33 of a caulking device during folding and molding as shown in FIG. 7, thereby easily deforming the tips of the piercing portions 25 and 26 during caulking and molding. Therefore, a moldability for folding and molding the piercing portions 25 and 26 can also be enhanced.

Figure 9:
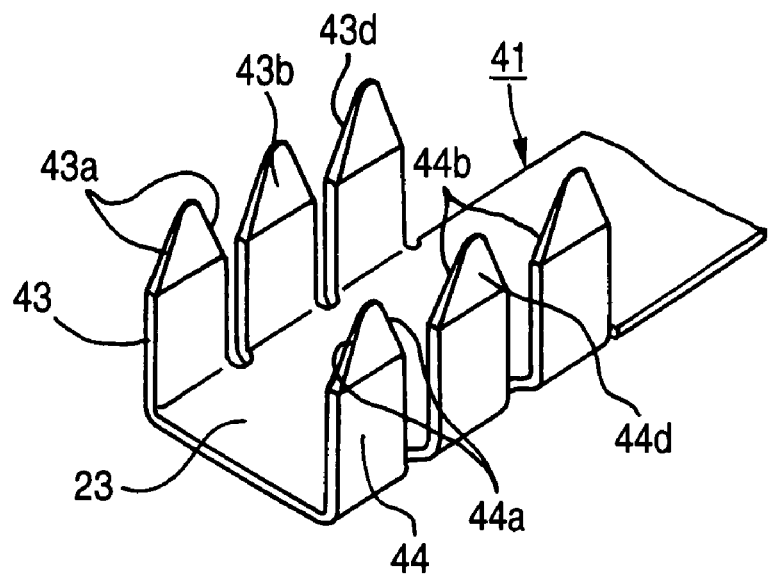
FIG. 9 is a perspective view showing a main part of an electric connecting terminal according to a third embodiment of the invention.
Figure 10:
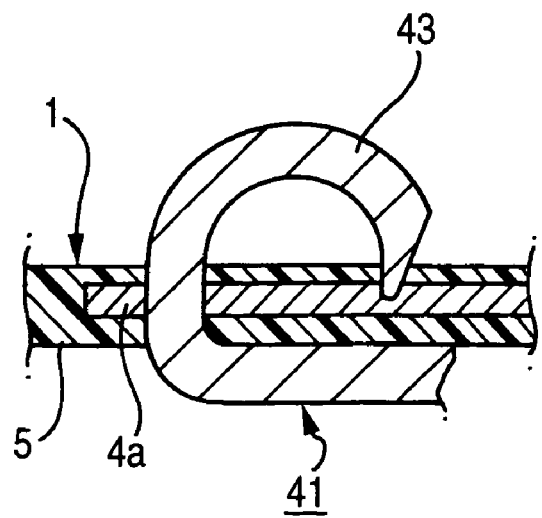
FIG. 10 is a sectional view showing a main part in which a piercing portion of the electric connecting terminal illustrated in FIG. 9 is connected to a flat circuit body.

FIGS. 9 and 10 show an electric connecting terminal 41 according to a third embodiment of the invention.

As shown in FIGS. 9 and 10, the electric connecting terminal 41 according to the third embodiment is connected to a flat circuit body 1 by causing the tips of three pairs of piercing portions 43 and 44 erected on both side edges of a plane portion 23 to penetrate through a coating 5 and a conductor 4a in the flat circuit body 1 and then folding the tips in such a direction as to approach each other.

The piercing portions 43 and 44 have such rectangular shapes that widths on the base portion side penetrating through the conductor 4a are almost constant, and only the tip side, which is folded after penetrating through the flat circuit body 1, is provided with taper portions 43a and 44a for gradually reducing widths and almost triangular shapes seen from the side.

Moreover, taper surfaces 43b, 43d (44b, 44d) for gradually reducing plate thicknesses toward the tips are provided on the internal and external surface sides of the piercing portions 43 and 44.

Figures 11A, 11B:
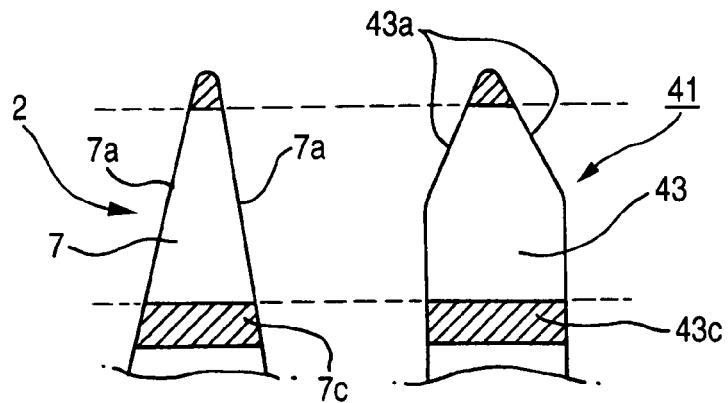
FIG. 11A and FIG. 11B are views illustrating a state in which the piercing portion of the electric connecting terminal shown in FIG. 10 is connected.

Hatching in FIG. 11A shows a contact portion of the conductor 4a and the piercing portion 7 of the related electric connecting terminal 2 provided with taper portions 7a and 7a formed over almost the whole region from a base of the piercing portion 7 to a tip thereof. Hatching in FIG. 11B shows a contact portion of the conductor 4a and the piercing portion 43 of the electric connecting terminal 41 according to the embodiment which is provided with the taper portions 43a and 43a formed on only the tip side of the piercing portion 43.

As is apparent from a comparison shown in FIGS. 11A and 11B, the width of the base of the piercing portion 43 (44) penetrating through the flat circuit body 1 in the electric connecting terminal 41 according to the embodiment can be increased as compared with the related electric connecting terminal 2 provided with the taper portion 7a (8a) for reducing the width of the piercing portion 7 (8) formed over almost the whole region from the base to the tip. As a result, it is possible to increase the contact area between the piercing portion 43 (44) penetrating through the conductor 4a of the flat circuit body 1 and the shear plane of the conductor 4a so that conducting reliability for the flat circuit body 1 can be enhanced correspondingly.

Moreover, the cross-sectional area of the base side of the piercing portion 43 (44) is almost constant. Therefore, even if a return due to a spring back after folding and molding is generated in the direction of penetration, the area of the contact with the conductor 4a is not reduced but excellent conducting reliability can be maintained.

Figure 12:
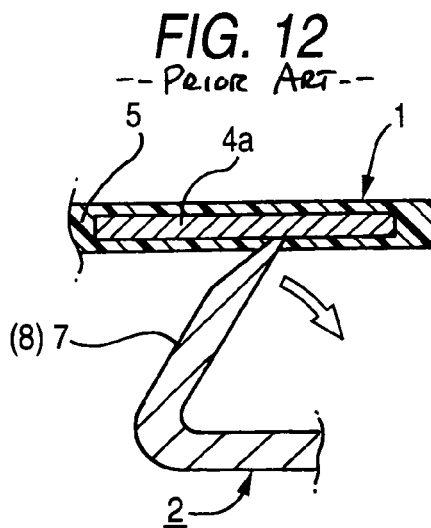
FIG. 12 is a view illustrating a penetrating performance of a piercing portion in a conventional electric connecting terminal.
Figure 13:
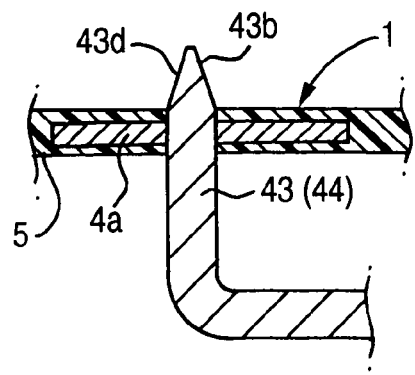
FIG. 13 is a view illustrating the penetrating performance of the piercing portion in the electric connecting terminal shown in FIG. 9.

In the related piercing portion 7 (8) having the taper portion 7a (8a) extended over almost the whole region of opposite side edges, the piercing portion 7 (8) becomes slender so that a buckling strength is reduced. Therefore, the piercing portion 7 (8) should be formed to prepare for a sufficient plate thickness or width in order to prevent the piercing portion 7 (8) from being buckled inwardly as shown in FIG. 12 when penetrating through the flat circuit body 1.

On the other hand, with the configuration of the piercing portion 43 (44) according to the embodiment, since the width of the piercing portion is reduced on only the tip portion side by the taper portion 43a (44a) the base side can be set to have a great strength. Therefore, the degree of freedom of a design can be increased and the buckling can easily be prevented during the penetrating work.

While three pairs of piercing portions of the electric connecting terminal have been provided in each of the embodiments, it is sufficient that at least one pair of piercing portions are provided in the invention, and setting is properly carried out in respect of maintenance of a mechanical connecting strength or an electric contact area.

According to the electric connecting terminal in accordance with the first aspect of the invention, as described above, when each of the tips of the piercing portions erected on opposite side edges of the plane portion of the electric connecting terminal is caused to penetrate through the conductor of the flat circuit body, the taper surfaces provided on the internal surface sides of the piercing portions cause such a drag as to compress and curve the conductor in a width direction of the conductor to act on the conductor at the inside of a base portion between the opposed piercing portions.

In the conductor curved between the opposed piercing portions, a shear plane can maintain a sufficient contact pressure for the internal surface of the base portion of each of the piercing portions by an elastic repulsion. Thus, excellent conducting reliability can be maintained.

According to the electric connecting terminal in accordance with the third aspect of the invention, as described above, as compared with a conventional electric connecting terminal having an almost triangular shape seen from the side by a taper portion reaching a tip from a base portion, the contact area on the base side of each piercing portion which is in contact with the shear plane of the conductor can be increased. Correspondingly, the conducting reliability can be enhanced.

Furthermore, the base side of the piercing portion has an almost constant cross-sectional area. Therefore, even if a return is generated in the direction of penetration through the spring back after folding and molding, the area of the contact with the conductor can be prevented from being reduced and excellent conducting reliability can be maintained.

What is claimed is:

1. An electric connecting terminal connected to a flat circuit body comprising:
    a plane portion;
    a pair of piercing portions erected from opposite side edges of the plane portion which penetrate through a coating and a conductor of the flat circuit body and tips thereof are folded in such a direction as to approach each other, wherein said piercing portions include a root portion and a distal portion, an internal surface of said distal portion being inclined with respect to an internal surface of said root portion so that said distal portion is tapered.

2. The electric connecting terminal according to claim 1, wherein an external surface opposed to the internal surface of each piercing portion is provided with a taper surface for gradually reducing the thickness of the piercing portion.

3. An electric connecting terminal connected to a flat circuit body comprising:
    a plane portion; and
    a pair of piercing portions erected from opposite side edges of the plane portion which penetrate through a coating and a conductor of the flat circuit body and are adapted to be folded in such a direction as to approach each other, said edges extending in a longitudinal direction of said terminal each of the piercing portions including:
        a first portion, one end of the first portion being connected to the edge of the plane portion, and
        a second portion connected to the other end of the first portion including a tip and a taper surface for gradually reducing a thickness of the second portion,
    wherein the pair of the taper surfaces face each other over the plane portion, wherein the first portion has an approximately constant width in said longitudinal direction.

4. The electric connecting terminal according to claim 3, wherein a width of the second portion becomes gradually narrow toward the tip thereof.

5. The electric connecting terminal according to claim 3, wherein a width of the second portion becomes gradually narrow toward the tip thereof.

6. The electric connecting terminal according to claim 3, wherein the second portion includes the taper surfaces on opposite sides thereof.

* * * * *